United States Patent
Himori et al.

(10) Patent No.: US 7,186,315 B2
(45) Date of Patent: Mar. 6, 2007

(54) PLASMA TREATMENT APPARATUS

(75) Inventors: Shinji Himori, Nirasaki (JP); Itsuko Sakai, Yokohama (JP)

(73) Assignees: Tokyo Electron Limited, Tokyo (JP); Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/402,950

(22) Filed: Apr. 1, 2003

(65) Prior Publication Data

US 2004/0020431 A1  Feb. 5, 2004

(30) Foreign Application Priority Data

Apr. 3, 2002  (JP) .............................. 2002-101394

(51) Int. Cl.
*H01L 21/306* (2006.01)
*C23C 16/00* (2006.01)

(52) U.S. Cl. .............................. 156/345.47; 118/723 E
(58) Field of Classification Search ............ 118/723 E; 156/345.43, 345.44, 345.45, 345.46, 345.47; 315/111.21

See application file for complete search history.

(56) References Cited

U.S. PATENT DOCUMENTS 5,772,833 A * 6/1998 Inazawa et al. ......... 156/345.47
6,422,172 B1 * 7/2002 Tanaka et al. ........... 118/723 R

FOREIGN PATENT DOCUMENTS

| JP | 03-014228 | | 1/1991 |
| JP | 04157164 A | * | 5/1992 |
| JP | 04157164 A | * | 5/1992 |
| JP | 07-003133 | | 1/1995 |
| JP | 07-074159 | | 3/1995 |
| JP | 11260596 A | * | 9/1999 |
| JP | 2000-156370 | | 6/2000 |
| JP | 2000-323456 | | 11/2000 |
| JP | 2001015495 A | * | 1/2001 |
| JP | 2001-313286 | | 11/2001 |

* cited by examiner

*Primary Examiner*—Parviz Hassanzadeh
*Assistant Examiner*—Michelle Crowell
(74) *Attorney, Agent, or Firm*—Oblon, Spivak, McClelland, Maier & Neustadt, P.C.

(57) ABSTRACT

There is provided a plasma treatment apparatus that carries out plasma treatment on an article, with which it is possible to make the plasma density uniform. A plasma treatment vessel houses a semiconductor wafer and a treatment gas is introduced into the plasma treatment vessel. A lower electrode is provided inside the plasma treatment vessel and the semiconductor wafer is placed onto the lower electrode. An upper electrode that has a plurality of holes formed therein and has a dome shape that is upwardly convex, is provided above the lower electrode in the plasma treatment vessel. A height of the upper electrode from the lower electrode becomes greater from an outside of the lower electrode to a center of the lower electrode.

6 Claims, 6 Drawing Sheets

PLASMA TREATMENT APPARATUS

BACKGROUND OF THE INVENTION

1. Field of the Invention

The present invention relates to a plasma treatment apparatus, and in particular to a plasma treatment apparatus that carries out plasma treatment on semiconductor wafers, which are articles to be treated.

2. Description of the Related Art

These days, in semiconductor device manufacturing processes, plasma treatment such as etching, sputtering, and CVD (chemical vapor deposition) is carried out on semiconductor wafers, which are articles to be treated.

Various types of plasma treatment apparatus are used for carrying out such plasma treatment, but capacitively coupled parallel plate plasma treatment apparatuses as described below are particularly commonly used.

As shown in FIG. 6, such a capacitively coupled parallel plate plasma treatment apparatus is comprised of a cylindrical vacuum vessel having therein an internal chamber (hereinafter referred to merely as the "chamber") 61 in which plasma treatment is carried out on a semiconductor wafer 60, and a pair of parallel plate electrodes, specifically an upper electrode 62 that is disposed in an upper part of the chamber 61 and a lower electrode 63 that is disposed in a lower part of the chamber 61.

The capacitively coupled parallel plate plasma treatment apparatus carries out plasma treatment on the semiconductor wafer 60, which is placed on the lower electrode 63 so as to face the upper electrode 62. The plasma for carrying out the plasma treatment is produced from a treatment gas introduced into the chamber 61 using a high-frequency electric field formed between the parallel plate electrodes.

In the case of etching a film such as an oxide film on the semiconductor wafer 60 using the capacitively coupled parallel plate plasma treatment apparatus, the inside of the chamber 61 is put into a medium pressure state, and a plasma of medium density is produced, whereby optimum radical control is made possible; as a result, a suitable plasma state can be obtained, and hence etching with a high degree of stability and reproducibility can be realized.

In this case, the plasma produced on the semiconductor wafer 60 diffuses isotropically through ambipolar diffusion toward grounded parts such as the upper electrode 62, a chamber side wall 64 and an exhaust plate 65. When the diffused plasma reaches such a grounded part, a high-frequency return current is generated, and this high-frequency return current flows back from the grounded part to the lower electrode 63.

However, in the chamber 61, in general the distance from the semiconductor wafer 60 on the lower electrode 63 to the chamber side wall 64 is greater than the distance from the semiconductor wafer 60 to the upper electrode 62, and hence the degree of diffusion of the produced plasma through the isotropic diffusion is increased in the direction of the chamber side wall 64. As a result, the plasma density around a peripheral part of the semiconductor wafer 60 near to the chamber side wall 64 becomes lower than the plasma density at a central part of the semiconductor wafer 60 facing the upper electrode 62, i.e. the plasma density in the chamber 61 becomes non-uniform, and hence there is a problem that the semiconductor wafer 60 etching rate distribution also becomes non-uniform.

Moreover, in addition to the isotropic diffusion of the plasma described above, it is known that another factor in the plasma density becoming non-uniform is non-uniformity in the high-frequency electric field distribution in the radial direction of the semiconductor wafer 60 due to standing waves produced on the electrode surface of the parallel plate electrode to which high-frequency electrical power is applied due to higher harmonic waves, which are reflected waves from the plasma, and the inductance of the electrode surface.

A plasma treatment apparatus disclosed in Japanese Laid-open Patent Publication (Kokai) No. 2000-323456 is known as an apparatus in which non-uniformity in the plasma density is eliminated by eliminating such non-uniformity in the high-frequency electric field distribution.

This plasma treatment apparatus has, as an upper electrode, an electrode plate that is comprised of an outside part that is made of a conductor or a semiconductor, and a central part that is constituted from a dielectric member or a high-resistance member. High-frequency electrical power is applied to the upper electrode.

With this plasma treatment apparatus, in the case that the central part is a dielectric member, the inductance component in the radial direction of the surface of the electrode plate that contacts the plasma can be cancelled out by the capacitance component of the dielectric member, and in the case that the central part is a high-resistance member, much of the high-frequency electrical power is consumed as Joule heat in the high-resistance member, and hence there is a drop in the electric field strength at the central part of the surface of the electrode plate that contacts the plasma, whereby non-uniformity in the high-frequency electric field distribution can be eliminated, and hence the plasma density can be made more uniform.

However, in the plasma treatment apparatus disclosed in Japanese Laid-open Patent Publication (Kokai) No. 2000-323456 described above, the material differs between the outside part and the central part of the upper electrode, to which the high-frequency electrical power is applied, and hence a potential difference is prone to occurring between the outside part and the central part; abnormal discharges may thus occur, resulting in the upper electrode wearing away rapidly, and due to this problem widespread use of the apparatus has not been possible.

SUMMARY OF THE INVENTION

It is an object of the present invention to provide a plasma treatment apparatus according to which the plasma density can be made uniform.

To attain the above object, according to a first aspect of the present invention, there is provided a plasma treatment apparatus that carries out plasma treatment on an article, comprising a vacuum vessel that houses the article and into which a treatment gas is introduced, a lower electrode that is provided inside the vacuum vessel and onto which is placed the article, and an upper electrode that is provided above the lower electrode in the vacuum vessel, wherein a height of the upper electrode from the lower electrode becomes greater from an outside of the lower electrode to a center of the lower electrode.

In the first aspect, preferably the upper electrode has at least one indentation that is upwardly convex.

In the first aspect, preferably the indentation has one shape selected from the group consisting of a cylindrical shape, a dome shape, and a conical shape.

To attain the above object, according to a second aspect of the present invention, there is provided a plasma treatment apparatus that carries out plasma treatment on an article, comprising a vacuum vessel that houses the article and into which a treatment gas is introduced, a lower electrode that is provided inside the vacuum vessel and onto which is placed the article, an upper electrode that is provided above the lower electrode in the vacuum vessel, and a high-frequency power source that supplies high-frequency electrical power, wherein the high-frequency power source supplies the high-frequency electrical power to the lower electrode, and wherein the upper electrode has a high-resistance part that is provided in a central part of the upper electrode, and an electrically conductive part that is provided surrounding the high-resistance part and has a lower resistance than the high-resistance part.

In the second aspect, preferably the high-resistance part is made of a material selected from the group consisting of Al, Si, SiC, $Al_2O_3$, and $SiO_2$.

To attain the above object, according to a third aspect of the present invention, there is provided a plasma treatment apparatus that carries out plasma treatment on an article, comprising a vacuum vessel that houses the article and into which a treatment gas is introduced, a lower electrode that is provided inside the vacuum vessel and onto which is placed the article, an upper electrode that is provided above the lower electrode in the vacuum vessel, and a high-frequency power source that supplies high-frequency electrical power, wherein the high-frequency power source supplies the high-frequency electrical power to the lower electrode, and wherein the upper electrode has an inside electrode part that is provided in a central part of the upper electrode, an outside electrode part that is provided surrounding the inside electrode part, an insulating part that is interposed between the outside electrode part and the inside electrode part, and an impedance part that is electrically connected between the inside electrode part and the outside electrode part.

In the third aspect, preferably the impedance part is a variable impedance element.

In the third aspect, preferably the variable impedance element is one selected from the group consisting of a variable inductor and a variable capacitor.

According to the first aspect of the present invention, the height of the upper electrode from the lower electrode becomes greater from the outside to the center. As a result, regarding the isotropic diffusion of the produced plasma, the degree of diffusion of the plasma in the direction of the upper electrode can be increased at the central part of the article which faces the upper electrode, and hence the plasma density at the central part of the article can be reduced; the plasma density over the article can thus be made more uniform.

Moreover, according to the first aspect of the present invention, the upper electrode preferably has at least one indentation that is upwardly convex. As a result, the height of the upper electrode from the lower electrode can easily be made to increase in a desired fashion from the outside to the center, and hence the occurrence of non-uniformity in the plasma density can be prevented easily.

Moreover, according to the first aspect of the present invention, the indentation preferably has one shape selected from the group consisting of a cylindrical shape, a dome shape, and a conical shape. As a result, the indentation can be formed easily.

According to the second aspect of the present invention, the high-frequency power source supplies the high-frequency electrical power to the lower electrode. As a result, a potential difference between the electrically conductive part and the high-resistance part of the upper electrode is eliminated, and thus the occurrence of abnormal discharges can be prevented, and hence wearing away of the upper electrode can be suppressed. Moreover, the upper electrode has a high-resistance part that is provided in the central part of the upper electrode, and an electrically conductive part that is provided surrounding the high-resistance part and has a lower resistance than the high-resistance part. As a result, generation of a high-frequency return current is suppressed in the high-resistance part, and hence the plasma density over the surface of the high-resistance part is reduced, and thus the plasma density at the central part of the article which faces the high-resistance part is reduced; the plasma density over the article can thus be made more uniform.

Moreover, according to the second aspect of the present invention, the high-resistance part is preferably made of a material selected from the group consisting of high-resistance materials such as Al, Si and SiC or the group consisting of dielectrics such as $Al_2O_3$ and $SiO_2$. As a result, generation of a high-frequency return current in the high-resistance part can be suppressed reliably, and moreover, because such a material can be obtained inexpensively, the making of the plasma density uniform can be achieved reliably and inexpensively.

According to the third aspect of the present invention, the high-frequency power source supplies the high-frequency electrical power to the lower electrode. As a result, a potential difference between the inside electrode part and the outside electrode part of the upper electrode is eliminated, and thus the occurrence of abnormal discharges can be prevented, and hence wearing away of the upper electrode can be suppressed. Moreover, the upper electrode has an inside electrode part that is provided in the central part of the upper electrode, an outside electrode part that is provided surrounding the inside electrode part, an insulating part that is interposed between the outside electrode part and the inside electrode part, and an impedance part that is electrically connected between the inside electrode part and the outside electrode part. As a result, generation of a high-frequency return current is suppressed in the inside electrode part, and hence the plasma density over the surface of the inside electrode part is reduced, and thus the plasma density at the central part of the article which faces the inside electrode part is reduced; the plasma density over the article can thus be made more uniform.

Moreover, according to the third aspect of the present invention, the impedance part is preferably a variable impedance element. As a result, by changing the resistance value of the impedance part, the high-frequency return current in the inside electrode part can be changed, and hence the plasma density over the surface of the inside electrode part can be changed; the plasma density at the central part of the article which faces the inside electrode part can thus be controlled, and hence the making of the plasma density uniform can be achieved easily.

Moreover, according to the third aspect of the present invention, the variable impedance element is preferably one selected from the group consisting of a variable inductor and a variable capacitor. As a result, the resistance value can be changed easily, and moreover, because such a variable inductor or variable capacitor can be obtained inexpensively, the making of the plasma density uniform can be achieved easily and inexpensively.

The above and other objects, features and advantages of the invention will become more apparent from the following detailed description taken in conjunction with the accompanying drawings.

DETAILED DESCRIPTION OF PREFERRED EMBODIMENTS

A detailed description of embodiments of the present invention will now be given with reference to the drawings.

First, a detailed description will be given of a plasma treatment apparatus according to a first embodiment of the present invention.

Figure 1:
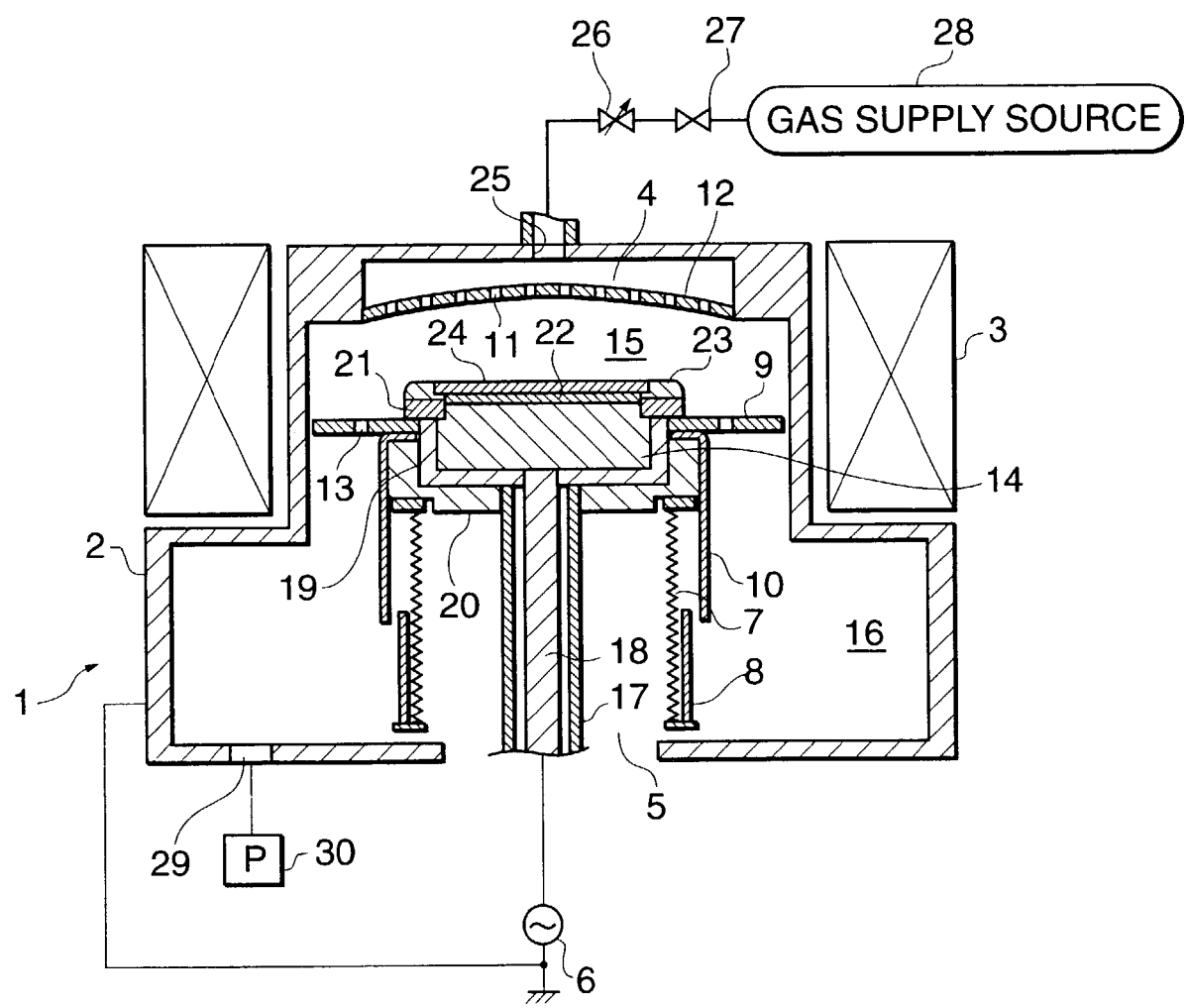
FIG. 1 is a schematic view showing the constitution of a plasma treatment apparatus according to a first embodiment of the present invention.

FIG. 1 is a schematic view showing the constitution of the plasma treatment apparatus according to the first embodiment of the present invention.

In FIG. 1, a plasma etching treatment apparatus 1 (plasma treatment apparatus) has a plasma treatment vessel 2 having a lower part that constitutes a first cylinder having a predetermined diameter, and an upper part that constitutes a second cylinder having a diameter smaller than that of the first cylinder. An annular permanent magnet 3 is fitted around the outside of the upper part of the plasma treatment vessel 2.

Moreover, the plasma treatment vessel 2 has inside a summit part of the upper part thereof a downward-facing recess 4, and has at a base part of the lower part thereof an opening 5. The plasma treatment vessel 2 is made of an electrically conductive material.

In the plasma treatment vessel 2, the opening 5 in the base part is closed off by an exhaust plate 9 and so on via bellows 7 that are made of an electrically conductive material such as stainless steel and rise up from the base part. The bellows 7 are protected by a first bellows cover 8 that rises up from the base part of the plasma treatment vessel 2, and a second bellows cover 10 that is fixed to the exhaust plate 9 so as to fit around the first bellows cover 8. The recess 4 in the summit part is closed off by an upper electrode 12 that has a plurality of holes 11 formed therein and has a dome shape that is upwardly convex.

The exhaust plate 9 is a ring-shaped disk having a plurality of vent holes 13 formed therein. The exhaust plate 9 has a disk-shaped lower electrode 14 in a central part thereof, and moreover partitions the inside of the plasma treatment vessel 2 into a chamber 15 and an exhaust chamber 16. Together with an inside wall of the plasma treatment vessel 2, the upper electrode 12 and the exhaust plate 9 constitute the walls of the chamber 15.

A central part of the lower electrode 14 is positioned directly below a summit part of the dome-shaped upper electrode 12. As a result, the height of the upper electrode 12 from the lower electrode 14 becomes greater from the outside to the central part.

Moreover, on a lower surface of the lower electrode 14 are fixed a tubular member 17 that is made of an electrically conductive material such as oxidized Al and extends out from the bottom of the plasma treatment vessel 2, and a raising/lowering shaft 18 that is housed inside the tubular member 17 and raises and lowers the lower electrode 14 in an up/down direction. The lower surface and a side surface of the lower electrode 14 are protected by an electrode protecting member 19, and furthermore a lower surface and a side surface of the electrode protecting member 19 are covered by an electrically conductive member 20. A high-frequency power source 6 is connected to the raising/lowering shaft 18.

An insulator ring 21 is disposed around the periphery of an upper surface of the lower electrode 14. An electrostatic chuck 22 is disposed on the upper surface of the lower electrode 14 inside the insulator ring 21. Moreover, a focus ring 23 is disposed on the insulator ring 21, and a semiconductor wafer 24 is placed as an article to be treated on the electrostatic chuck 22 inside the focus ring 23.

The plasma treatment vessel 2 has a gas supply port 25 in the summit part thereof. A gas supply source 28 for supplying a treatment gas into the chamber 15 is connected to the gas supply port 25 via a flow regulating valve 26 and an opening/closing valve 27. Moreover, the plasma treatment vessel 2 has an exhaust port 29 in the base part thereof, and a vacuum pump 30 for evacuating the chamber 15 is connected to the exhaust port 29.

When plasma treatment is carried out on the semiconductor wafer 24 using the plasma etching treatment apparatus 1 constituted as described above, first the raising/lowering shaft 18 is moved upward using a driving mechanism, not shown, thus moving the semiconductor wafer 24 to a predetermined position, and then high-frequency electrical power is applied to the lower electrode 14 using the high-frequency power source 6.

Next, the chamber 15 is evacuated to a predetermined vacuum atmosphere using the vacuum pump 30, and then the treatment gas, which contains a fluorocarbon gas, is introduced into the chamber 15 from the gas supply source 28 via the gas supply port 25, whereupon a glow discharge is generated due to the high-frequency electric field that has been formed between the upper electrode 12 and the lower electrode 14, and hence a plasma is produced on the semiconductor wafer 24 from the treatment gas.

The produced plasma diffuses isotropically toward the walls of the chamber 15, which are grounded parts, and is thus distributed over the semiconductor wafer 24, whereby the semiconductor wafer 24, a surface thereof being masked, for example, by an oxide film, is etched.

Regarding the isotropic diffusion of the produced plasma, because in the plasma etching treatment apparatus 1 the height of the dome-shaped upper electrode 12 from the disk-shaped lower electrode 14 on which the semiconductor wafer 24 is placed becomes greater from the outside to the central part, the degree of diffusion of the plasma in the direction of the upper electrode 12 can be increased at the central part of the semiconductor wafer 24.

Subsequently, after reaching a grounded part, the plasma generates a high-frequency return current, and this high-frequency return current flows back to the high-frequency power source 6.

According to the plasma treatment apparatus of the first embodiment described above, the height of the upper electrode 12 from the lower electrode 14 becomes greater from the outside to a central part, and hence regarding the isotropic diffusion of the produced plasma, the degree of diffusion of the plasma in the direction of the upper electrode 12 can be increased at the central part of the semiconductor wafer 24. As a result, the plasma density at the central part of the semiconductor wafer 24 can be reduced, and hence the plasma density over the semiconductor wafer 24 can be made more uniform.

In the embodiment described above, the upper electrode 12 was formed in a dome shape that is upwardly convex; however, the shape of the upper electrode 12 is not limited to being a simple dome shape, but rather may also be a shape having a cylinder in a central part, or a conical shape, or may be a combination of such shapes. Specifically, the upper electrode 12 may be formed into an appropriate shape in accordance with the distribution of the plasma produced on the semiconductor wafer 24.

Moreover, if a constitution is adopted in which the upper electrode 12 is fitted into the recess 4 via a rubber O-ring or the like, and a plurality of upper electrodes 12 each having a different shape are prepared, then replacement of the upper electrode 12 can be carried out easily, and various plasma distributions can be provided for; setting can thus be carried out quickly and easily when the type of the semiconductor wafer 24, the type of the treatment gas, or the type of a mask pattern is changed.

Next, a detailed description will be given of a plasma treatment apparatus according to a second embodiment of the present invention.

Figure 2:
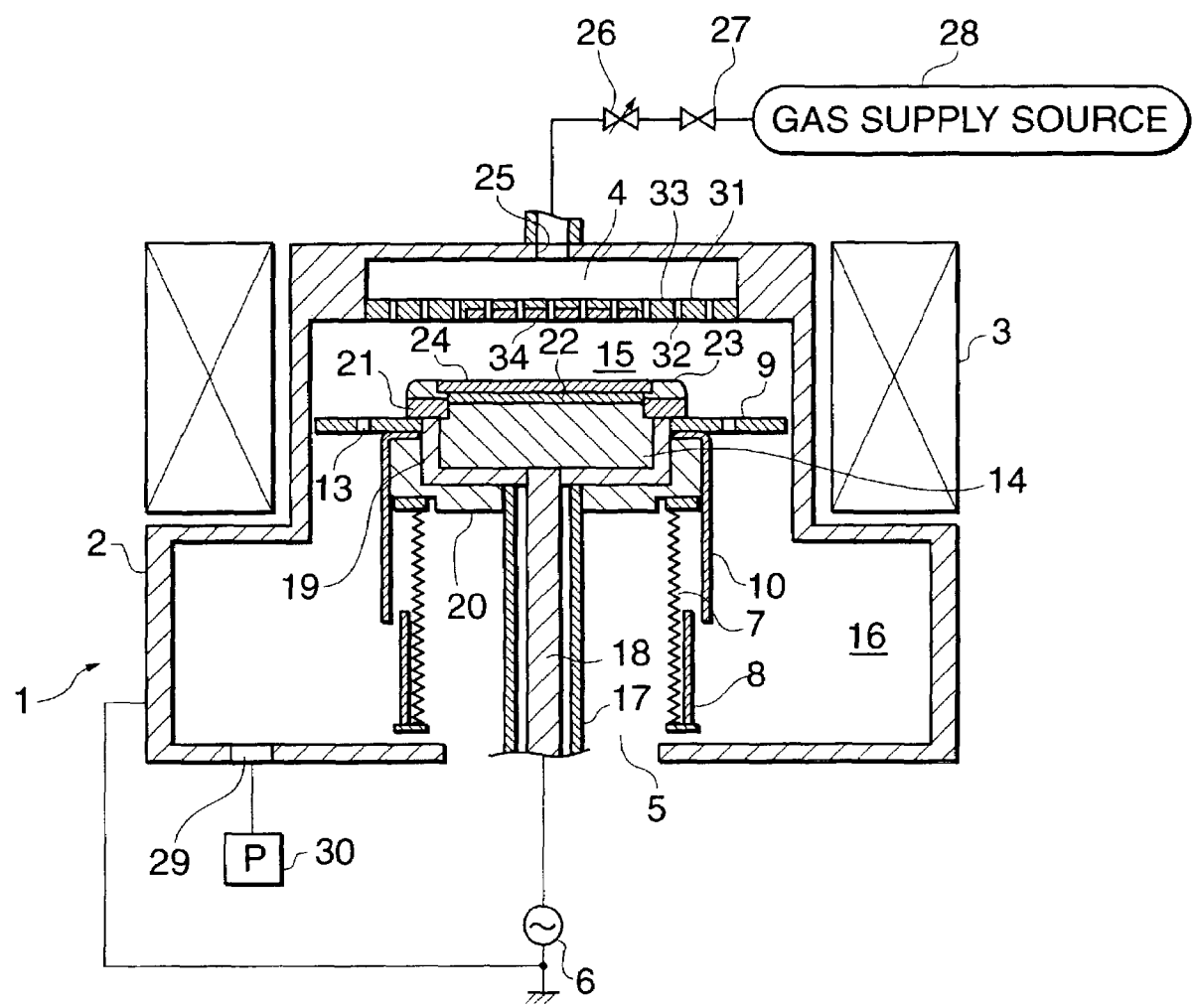
FIG. 2 is a schematic view showing the constitution of a plasma treatment apparatus according to a second embodiment of the present invention.

FIG. 2 is a schematic view showing the constitution of the plasma treatment apparatus according to the second embodiment of the present invention.

In the second embodiment, the constitution of the plasma treatment apparatus is basically the same as in the first embodiment described above, and hence component elements in the second embodiment that are the same as ones in the first embodiment will be represented by the same reference numeral as in the first embodiment, and redundant repeated description will be omitted. In the following, a description will be given of parts in the second embodiment that are different to those in the first embodiment.

In FIG. 2, an upper electrode 31 is a disk having a plurality of holes 32 formed therein. The upper electrode 31 is comprised of an electrically conductive part 33 that is provided around an outer periphery of the upper electrode 31 and is made of a conductor or a semiconductor, and a high-resistance part 34 that is provided inside the electrically conductive part 33 and is made of Al and thus has a higher resistance than the electrically conductive part 33.

In this case, in the plasma etching treatment apparatus 1, the upper electrode 31 and the lower electrode 14 are provided facing one another such that the respective central parts thereof are aligned, and hence the high-resistance part 34 faces the central part of the semiconductor wafer 24 placed on the lower electrode 14.

In this plasma etching treatment apparatus 1, a plasma is produced through the high-frequency power source 6 applying a high-frequency current to the lower electrode 14.

Moreover, in the plasma etching treatment apparatus 1, after reaching a grounded part, the plasma generates a high-frequency return current, and this high-frequency return current flows back to the high-frequency power source 6; however, generation of a high-frequency return current is suppressed in the high-resistance part 34, and hence the plasma density over the surface of the high-resistance part 34 is reduced, and thus the plasma density at the central part of the semiconductor wafer 24 facing the high-resistance part 34 is reduced.

According to the plasma treatment apparatus of the second embodiment described above, the plasma is produced through high-frequency electrical power being applied to the lower electrode 14, and hence a potential difference between the electrically conductive part 33 and the high-resistance part 34 in the upper electrode 31 is eliminated, and thus the occurrence of abnormal discharges can be prevented, and hence wearing away of the upper electrode 31 can be suppressed. Moreover, the upper electrode 31 is comprised of a high-resistance part 34 that is provided in the central part of the upper electrode 31, and an electrically conductive part 33 that is provided outside the high-resistance part 34 and has a lower resistance than the high-resistance part 34, and hence generation of a high-frequency return current is suppressed in the high-resistance part 34, and thus the plasma density over the surface of the high-resistance part 34 is reduced, and hence the plasma density at the central part of the semiconductor wafer 24 facing the high-resistance part 34 is reduced; as a result, the plasma density over the semiconductor wafer 24 can be made more uniform.

In the second embodiment described above, the high-resistance part 34 was made of Al; however, the material of the high-resistance part 34 is not limited to being Al, but rather may also be a material selected from the group consisting of high-resistance materials such as Si and SiC or the group consisting of dielectrics such as $Al_2O_3$ and $SiO_2$, or may be a composite of such materials. Specifically, the material of the high-resistance part 34 need merely be a material exhibiting a resistance of at least a certain predetermined value; as a result, generation of a high-frequency return current in the high-resistance part 34 can be suppressed reliably, and moreover, because such a material can be obtained inexpensively, the making of the plasma density uniform can be achieved reliably and inexpensively.

Moreover, if a plurality of high-resistance parts 34 exhibiting different resistance values to one another are prepared, then various plasma distributions can be provided for; setting can thus be carried out quickly and easily when the type of the semiconductor wafer 24, the type of the treatment gas, or the type of a mask pattern is changed.

Furthermore, in the case of carrying out dual frequency dry etching, the plasma density can be made uniform by, for example, adjusting the skin depth of the high-resistance part 34, and thus changing the path of the high-frequency current, without affecting a low-frequency current.

Next, a detailed description will be given of a plasma treatment apparatus according to a third embodiment of the present invention.

Figure 3:
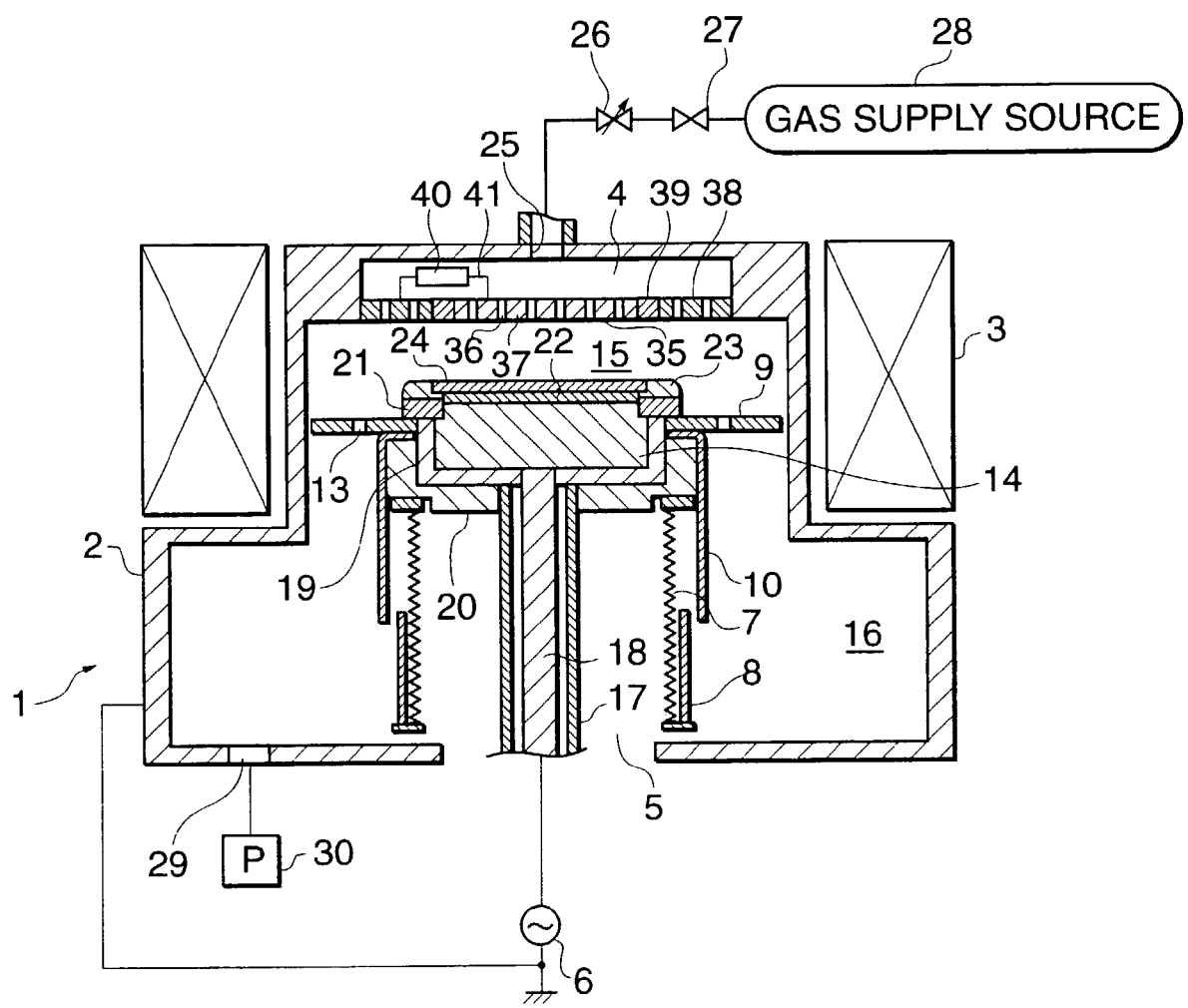
FIG. 3 is a schematic view showing the constitution of a plasma treatment apparatus according to a third embodiment of the present invention.

FIG. 3 is a schematic view showing the constitution of the plasma treatment apparatus according to the third embodiment of the present invention.

In the third embodiment, the constitution of the plasma treatment apparatus is basically the same as in the first embodiment described above, and hence component elements in the third embodiment that are the same as ones in the first embodiment will be represented by the same reference numeral as in the first embodiment, and redundant repeated description will be omitted. In the following, a description will be given of parts in the third embodiment that are different to those in the first embodiment.

In FIG. 3, an upper electrode 35 is a disk having a plurality of holes 36 formed therein. The upper electrode 35 is comprised of an inside electrode part 37 that is provided in a central part of the upper electrode 35 and is made of a conductor, an outside electrode part 38 that is provided surrounding the inside electrode part 37 and is made of a conductor, an insulating part 39 that is interposed between the outside electrode part 38 and the inside electrode part 37, and a resistive circuit 41 that electrically connects the inside electrode part 37 and the outside electrode part 38 together via a variable impedance element 40.

In this case, in the plasma etching treatment apparatus 1, the upper electrode 35 and the lower electrode 14 are provided facing one another such that the respective central parts thereof are aligned, and hence the inside electrode part 37 faces the central part of the lower electrode 14, and thus faces the central part of the semiconductor wafer 24.

When plasma treatment is carried out on the semiconductor wafer 24 using the plasma etching treatment apparatus 1, a plasma is produced by applying a high-frequency current to the lower electrode 14.

Moreover, in the plasma etching treatment apparatus 1, after reaching a grounded part, the plasma generates a high-frequency return current, and this high-frequency return current flows back to the high-frequency power source 6; however, by changing the resistance value of the variable impedance element 40, the value of the high-frequency return current in the inside electrode part 37 can be changed, and hence the plasma density over the surface of the inside electrode part 37 can be changed. The plasma density at the central part of the semiconductor wafer 24 facing the inside electrode part 37 can thus be controlled.

Moreover, by using the variable impedance element 40, the resistance value can be changed individually in different frequency ranges as described below.

Referring to the drawings, a description will now be given of individual changes in the resistance value in different frequency ranges in the case of using a variable impedance element 40.

First, a description will be given for the case of using a variable inductor as the variable impedance element 40.

FIGS. 4A to 4D are graphs useful in explaining the individual changes in the resistance value in the case of using a variable inductor as the variable impedance element 40 appearing in FIG. 3.

Figure 4C:
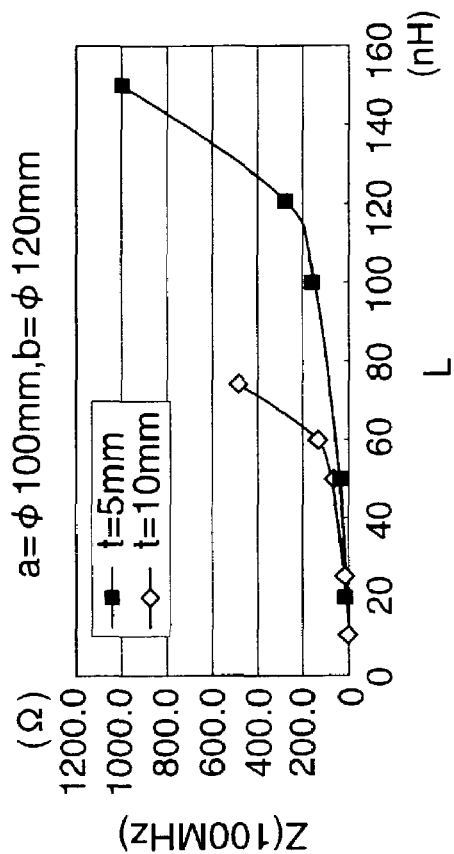
FIGS. 4A to 4D are graphs useful in explaining individual changes in resistance value in the case of using a variable inductor as a variable impedance element appearing in FIG. 3.
Figure 4D:
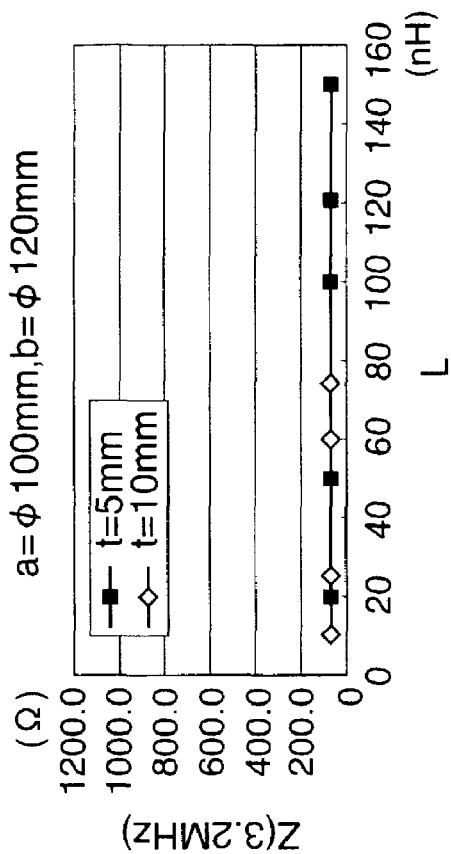
Figure 4A:
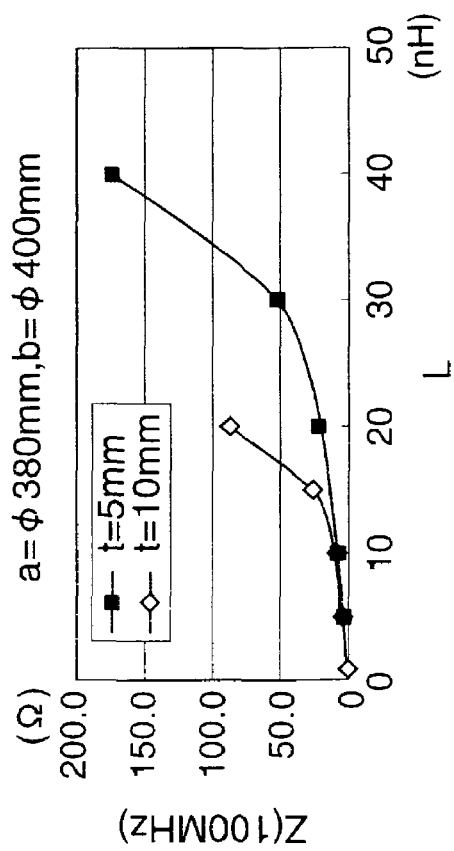
Figure 4B:
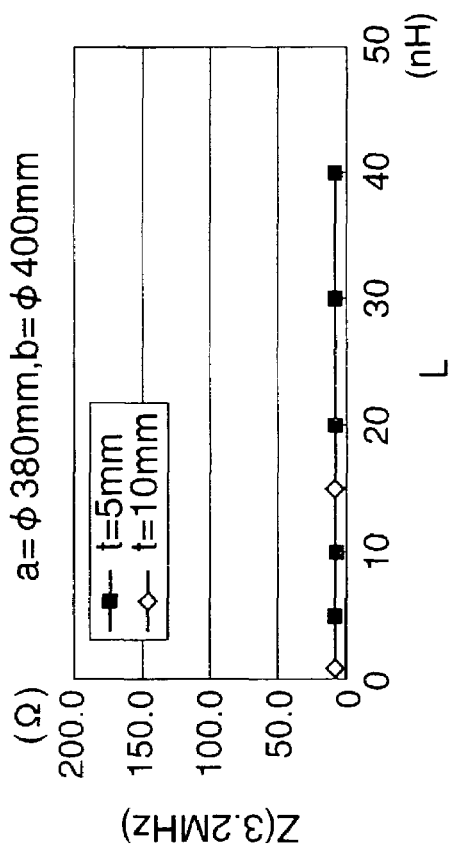

FIG. 4A shows the change in the resistance value (impedance) at 100 MHz upon changing the inductance of the variable inductor and the thickness of an upper electrode 35 in which the outside diameter a of the inside electrode part 37 is 380 mm and the outside diameter b of the outside electrode part 38 is 400 mm. FIG. 4B shows the change in the resistance value at 3.2 MHz upon changing the inductance of the variable inductor and the thickness of an upper electrode 35 in which the outside diameter a of the inside electrode part 37 is 380 mm and the outside diameter b of the outside electrode part 38 is 400 mm.

FIGS. 4A and 4B show that the resistance value at 100 MHz increases as the inductance of the variable inductor is increased, and increases suddenly once the inductance of the variable inductor has exceeded a certain value, whereas the resistance value at 3.2 MHz only increases extremely slightly as the inductance of the variable inductor is increased.

Consequently, by using a variable inductor and changing the inductance thereof, the value of the high-frequency return current in the inside electrode part 37 in a high-frequency range (e.g. around 100 MHz), which is the main factor in plasma production, can be changed, and hence the plasma density over the surface of the inside electrode part 37 can be changed, without changing the value of the return current in a low-frequency range (e.g. around 3.2 MHz). The plasma density at the central part of the semiconductor wafer 24 facing the inside electrode part 37 can thus be controlled, without changing the value of the return current in a low-frequency range.

FIG. 4C shows the change in the resistance value at 100 MHz upon changing the inductance of the variable inductor and the thickness of an upper electrode 35 in which the outside diameter a of the inside electrode part 37 is 100 mm and the outside diameter b of the outside electrode part 38 is 120 mm. FIG. 4D shows the change in the resistance value at 3.2 MHz upon changing the inductance of the variable inductor and the thickness of an upper electrode 35 in which the outside diameter a of the inside electrode part 37 is 100 mm and the outside diameter b of the outside electrode part 38 is 120 mm.

As with FIGS. 4A and 4B, FIGS. 4C and 4D show that the resistance value at 100 MHz increases as the inductance of the variable inductor is increased, whereas the resistance value at 3.2 MHz only increases extremely slightly as the inductance of the variable inductor is increased.

Moreover, FIGS. 4A and 4C show that upon changing the thickness of the upper electrode 35 or the outside diameters of the inside electrode part 37 and the outside electrode part 38, there is a change in the degree of increase in the resistance value at 100 MHz, and moreover there is a change in the value of the inductance of the variable inductor at which the resistance value suddenly increases.

Consequently, also by changing the thickness of the upper electrode 35 or the outside diameters of the inside electrode part 37 and the outside electrode part 38, the value of the high-frequency return current can be changed, and hence the plasma density over the surface of the inside electrode part 37 can be changed; the plasma density at the central part of the semiconductor wafer 24 facing the inside electrode part 37 can thus be controlled.

In the case of using a variable inductor as the variable impedance element 40 of the upper electrode 35 in the plasma etching treatment apparatus 1, it is preferable from the viewpoint of control stability to change the inductance of the variable inductor only within a range up to the certain value thereof at which the resistance value increases suddenly in FIG. 4A or FIG. 4C.

Next, a description will be given for the case of using a variable capacitor placed in parallel with an inductor as the variable impedance element 40 appearing in FIG. 3.

FIGS. 5A to 5D are graphs useful in explaining the individual changes in the resistance value in the case of using a variable capacitor as the variable impedance element 40 appearing in FIG. 3.

Figure 5A:
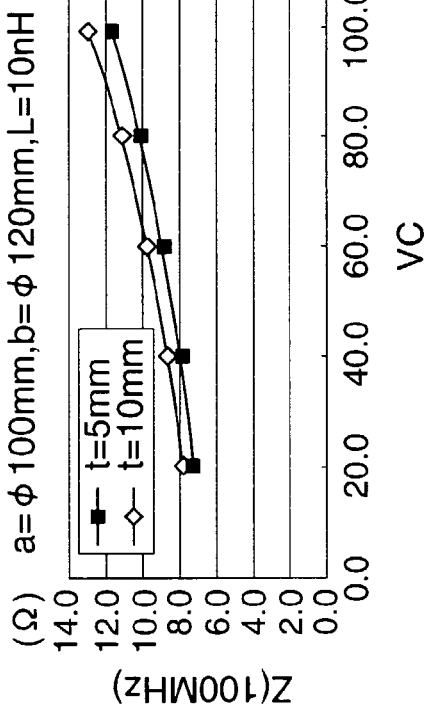
FIGS. 5A to 5D are graphs useful in explaining individual changes in resistance value in the case of using a variable capacitor as the variable impedance element appearing in FIG. 3.
Figure 5B:
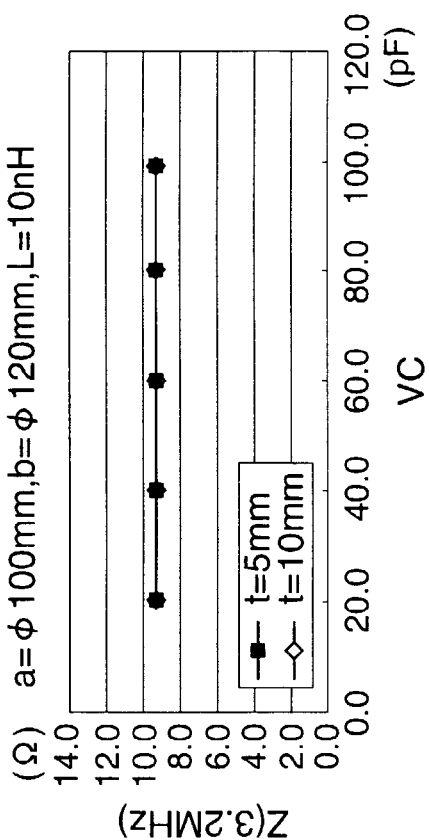

FIG. 5A shows the change in the resistance value at 100 MHz upon changing the capacitance of the variable capacitor and the thickness of an upper electrode 35 in which the outside diameter a of the inside electrode part 37 is 380 mm and the outside diameter b of the outside electrode part 38 is 400 mm. FIG. 5B shows the change in the resistance value at 3.2 MHz upon changing the capacitance of the variable capacitor and the thickness of an upper electrode 35 in which the outside diameter a of the inside electrode part 37 is 380 mm and the outside diameter b of the outside electrode part 38 is 400 mm.

FIGS. 5A and 5B show that the resistance value at 100 MHz increases as the capacitance of the variable capacitor is increased, whereas the resistance value at 3.2 MHz does not change as the capacitance of the variable capacitor is increased.

Consequently, by using a variable capacitor and changing the capacitance thereof, the value of the high-frequency return current in the inside electrode part 37 in a high-frequency range, which is the main factor in plasma production, can be changed, and hence the plasma density over the surface of the inside electrode part 37 can be changed, and thus the plasma density at the central part of the semiconductor wafer 24 facing the inside electrode part 37 can be controlled, without changing the value of the return current in a low-frequency range.

Figure 5C:
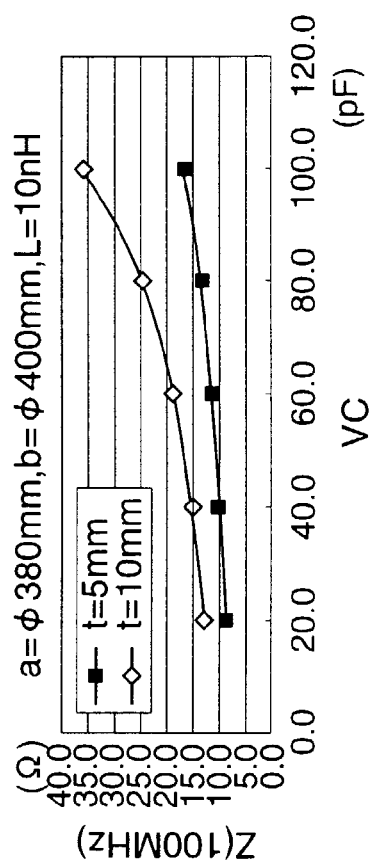
Figure 5D:
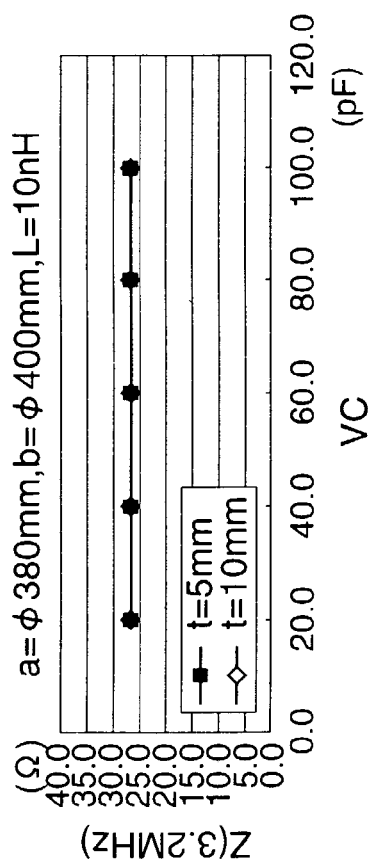
Figure 6:
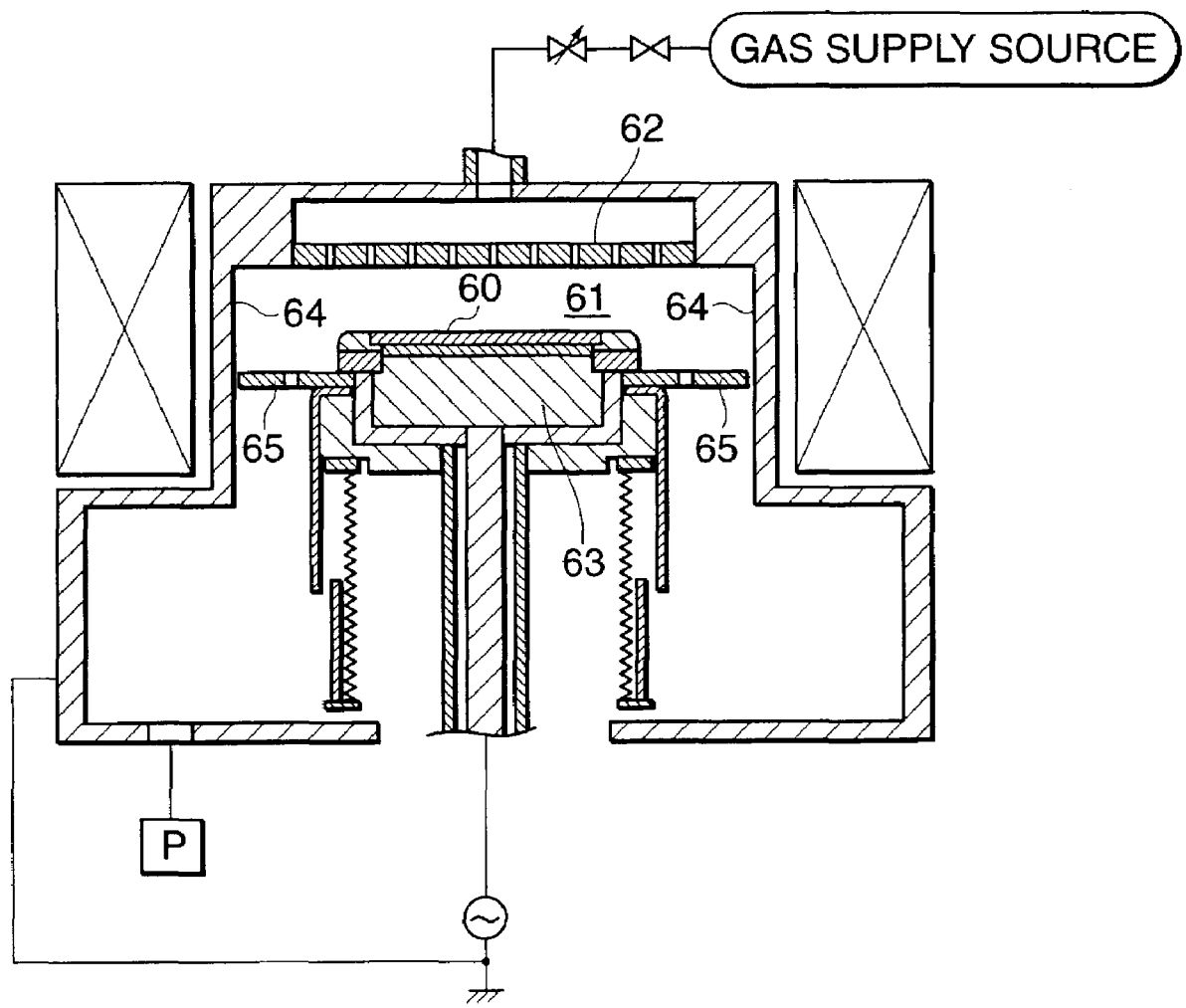
FIG. 6 is a schematic view showing the constitution of a conventional capacitively coupled parallel plate plasma treatment apparatus.

FIG. 5C shows the change in the resistance value at 100 MHz upon changing the capacitance of the variable capacitor and the thickness of an upper electrode 35 in which the outside diameter a of the inside electrode part 37 is 100 mm and the outside diameter b of the outside electrode part 38 is 120 mm. FIG. 5D shows the change in the resistance value at 3.2 MHz upon changing the capacitance of the variable capacitor and the thickness of an upper electrode 35 in which the outside diameter a of the inside electrode part 37 is 100 mm and the outside diameter b of the outside electrode part 38 is 120 mm.

As with FIGS. 5A and 5B, FIGS. 5C and 5D show that the resistance value at 100 MHz increases as the capacitance of the variable capacitor is increased, whereas the resistance value at 3.2 MHz does not change as the capacitance of the variable capacitor is increased.

Moreover, FIGS. 5A and 5C show that upon changing the thickness of the upper electrode 35 or the outside diameters of the inside electrode part 37 and the outside electrode part 38, there is a change in the degree of increase in the resistance value at 100 MHz.

Consequently, as in the case of using a variable inductor as the variable impedance element 40, also by changing the thickness of the upper electrode 35 or the outside diameters of the inside electrode part 37 and the outside electrode part 38, the value of the high-frequency return current can be changed, and hence the plasma density over the surface of the inside electrode part 37 can be changed; the plasma density at the central part of the semiconductor wafer 24 facing the inside electrode part 37 can thus be controlled.

Moreover, FIGS. 5A and 5C show that in the case of using a variable capacitor as the variable impedance element 40, there is no sudden rise in the resistance value as in the case of using a variable inductor shown in FIGS. 4A and 4C.

Consequently, it is preferable from the viewpoint of control stability to use a variable capacitor as the variable impedance element 40 of the upper electrode 35 in the plasma etching treatment apparatus 1.

In any of the cases described above, the insulating part 39 is made of $Al_2O_3$, $SiO_2$, or the like.

According to the plasma treatment apparatus of the third embodiment described above, the plasma is produced through high-frequency electrical power being applied to the lower electrode 14, and hence a potential difference between the inside electrode part 37 and the outside electrode part 38 in the upper electrode 35 is eliminated, and thus the occurrence of abnormal discharges can be prevented, and hence wearing away of the upper electrode 35 can be suppressed. Moreover, the upper electrode 35 is comprised of the inside electrode part 37, which is provided in a central part of the upper electrode 35 and is made of a conductor, the outside electrode part 38, which is provided surrounding the inside electrode part 37 and is made of a conductor, the insulating part 39, which is interposed between the outside electrode part 38 and the inside electrode part 37, and the resistive circuit 41, which electrically connects the inside electrode part 37 and the outside electrode part 38 together via the variable impedance element 40. Consequently, by changing the resistance value of the variable impedance element 40, a high-frequency return current in the inside electrode part 37 can be changed, and hence the plasma density over the surface of the inside electrode part 37 can be changed; as a result, the plasma density at the central part of the semiconductor wafer 24 facing the inside electrode part 37 can be controlled, and hence the occurrence of non-uniformity in the plasma density can easily be prevented.

Furthermore, according to the plasma treatment apparatus of the third embodiment, because the plasma density at the central part of the semiconductor wafer 24 facing the inside electrode part 37 can be controlled merely by changing the resistance value, various plasma distributions can be provided for, and hence setting can be carried out quickly and easily when the type of the semiconductor wafer 24, the type of the treatment gas, or the type of a mask pattern is changed.

In the third embodiment described above, the variable impedance element 40 is preferably either a variable inductor or a variable capacitor. As a result, the resistance value can be changed easily, and moreover, because such a variable inductor or variable capacitor can be obtained inexpensively, the occurrence of non-uniformity in the plasma density can be prevented easily and inexpensively. In particular, using a variable capacitor is preferable from the viewpoint of control stability, since in this case there is no sudden rise in the resistance value in a high-frequency range.

Moreover, the inside electrode part 37 and the outside electrode part 38 may be connected together via an electrical resistor exhibiting a predetermined resistance value instead of the variable impedance element 40. In this case, generation of a high-frequency return current is suppressed in the inside electrode part 37, and hence the plasma density over the surface of the inside electrode part 37 is reduced, and thus the plasma density at the central part of the semiconductor wafer 24 facing the inside electrode part 37 is reduced; as a result, the plasma density over the semiconductor wafer 24 can be made more uniform.

Above, first to third embodiments of the present invention have been described separately; however, each of these embodiments does not necessarily have to be implemented separately, but rather a combination of the embodiments may be implemented. For example, the upper electrode 12 in the first embodiment may be constituted from a high-resistance part that is provided in a central part of the upper electrode 12, and an electrically conductive part that is provided surrounding the high-resistance part and has a lower resistance than the high-resistance part; alternatively, the upper electrode 12 in the first embodiment may be constituted from an inside electrode part that is provided in a central part of the upper electrode 12 and is made of a conductor, an outside electrode part that is provided surrounding the inside electrode part and is made of a conductor, an insulating part that is interposed between the outside electrode part and the inside electrode part, and a resistive circuit that connects the inside electrode part and the outside electrode part together via a variable impedance element.

Further, although in the above described first to third embodiments, semiconductor wafers are treated by the plasma treatment apparatus as articles to be treated, the present invention is not limited to this. Any articles to be treated such as LCD (Liquid Crystal Display) substrates may be treated by the plasma treatment apparatus described above.

What is claimed is:

1. A plasma treatment apparatus that carries out plasma treatment on an article, the plasma treatment apparatus comprising:
    a vacuum vessel that houses the article and into which a treatment gas is introduced;
    a lower electrode that is provided inside said vacuum vessel and onto which is placed the article;
    an upper electrode that is provided above said lower electrode in said vacuum vessel; and
    a high-frequency power source that supplies high-frequency electrical power;
    wherein a return current flows back to said high-frequency power source;
    wherein said high-frequency power source supplies the high-frequency electrical power to said lower electrode;
    wherein said upper electrode has an inside electrode part that is provided in a central part of said upper electrode, an outside electrode part that is provided surrounding said inside electrode part, an insulating part that is interposed between said outside electrode part and said inside electrode part, and a variable impedance part that is electrically connected between said inside electrode part and said outside electrode part; and
    wherein said variable impedance part changes inductance or capacitance thereof such that respective impedances in different frequency ranges are individually changed so as to change a value of return current in a high-frequency range among return currents corresponding to respective frequency ranges which flows back to said high-frequency power source via said inside electrode part without changing a value of return current in a low-frequency range.

2. A plasma treatment apparatus as claimed in claim 1, wherein said variable impedance part is one selected from the group consisting of a variable inductor and a variable capacitor.

3. A plasma treatment apparatus as claimed in claim 1, wherein said inside electrode part is grounded via said variable impedance part and said outside electrode part.

4. A plasma treatment apparatus as claimed in claim 1, wherein said insulating part is made of $Al_2O_3$ or $SiO_2$.

5. A plasma treatment apparatus as claimed in claim 1, wherein a frequency corresponding to the return current in the high-frequency range is 100 MHz.

6. A plasma treatment apparatus as claimed in claim 1, wherein a frequency corresponding to the return current in the low-frequency range is 3.2 MHz.

* * * * *